United States Patent [19]

Burroughs et al.

[11] Patent Number: 4,962,347
[45] Date of Patent: Oct. 9, 1990

[54] FLASHLIGHT WITH BATTERY TESTER

[75] Inventors: James R. Burroughs, Encino; Alan N. O'Kain, Corona del Mar, both of Calif.

[73] Assignee: Strategic Energy, Ltd., Newport Beach, Calif.

[21] Appl. No.: 160,143

[22] Filed: Feb. 25, 1988

[51] Int. Cl.⁵ ............................................... H02J 7/04
[52] U.S. Cl. ...................................... 320/48; 340/636; 362/208
[58] Field of Search ............... 320/2, 43, 48; 362/157, 362/205, 208, ; 340/636

[56] References Cited

U.S. PATENT DOCUMENTS

| | | | |
|---|---|---|---|
| 2,921,254 | 1/1960 | Marche | 320/48 |
| 3,383,580 | 5/1968 | Wallace, Jr. | 320/48 |
| 3,534,354 | 10/1970 | Galginaitis | 320/48 |
| 4,231,026 | 10/1980 | Sullivan | 340/636 |
| 4,432,041 | 2/1984 | Pfisterer et al. | 340/636 |
| 4,563,629 | 1/1986 | Keiper | 340/636 X |
| 4,626,765 | 12/1986 | Tanaka | 320/48 |
| 4,701,835 | 10/1987 | Campagnudo et al. | 320/2 |
| 4,725,784 | 2/1988 | Peled et al. | 320/48 |

*Primary Examiner*—Steven L. Stephan
*Assistant Examiner*—Kristine Peckman

[57] ABSTRACT

A flashlight or a portable lantern having a built-in battery tester to determine the voltage or capacity of the battery, either under an electrical load or under no electrical load. The battery tester can comprise a voltmeter, ammeter, liquid-crystal cell, LED, color-indicating redox voltage-indicator cell, or a voltage battery-monitoring circuit that intermittently monitors the voltage of the batteries for brief pulses, compares the battery voltage with the standard reference voltage, and initiates a signal system if the battery voltage falls below the standard reference voltage.

39 Claims, 3 Drawing Sheets

FLASHLIGHT WITH BATTERY TESTER

FIELD OF THE INVENTION

The present invention relates to battery-powered flashlights and portable lanterns having a built-in device for determining the strength, voltage, or capacity of the batteries. More particularly, the present invention relates to battery-powered flashlights and portable lanterns having analog and digital readout voltmeters, analog and digital readout ammeters, color-indicating chemical cells which indicate when the batteries are above or below a predetermined voltage, a liquid-crystal cell which indicates when the batteries are above or below a predetermined voltage value, and/or LED array which indicates when the batteries are above or below one or more predetermined voltage value(s).

BACKGROUND OF THE INVENTION

Flashlights and portable lanterns are used extensively in this country and abroad Almost every home and business has at least one flashlight or portable lantern, and many homes and businesses have several flashlights, including at least one emergency flashlight. In addition, many people carry at least one flashlight in their automobiles, recreational vehicles, trucks, boats, or airplanes. The majority of the flashlights and portable lanterns are used on an infrequent basis, that is, during an emergency situation where there has been a power failure or when it is not convenient to use a light source powered by a conventional household current, such as outdoor uses.

The majority of flashlights and batteries are powered by dry-cell non-rechargeable batteries. Non-rechargeable alkaline batteries sold under the trademarks Eveready, Duracell, Ray-O-Vac, and the like, have a number of advantages over rechargeable batteries. Principally, on a weight-to-weight and volume-to-volume basis, the alkaline can supply three to four times the wattage of a rechargeable battery. In addition, non-rechargeable dry-cell batteries put out a higher voltage (about 1.5 volts) than rechargeable dry-cell-type batteries (about 1.2 volts). Rechargeable batteries, even if not in use, have to be periodically recharged to keep the batteries from falling below a defined charge level to prevent permanent damage to the batteries. Alkaline batteries which are used infrequently can have a shelf- or storage-life of from three to five years. During this period, no maintenance of the batteries is required. In contrast, most rechargeable batteries will completely discharge within six months of their last recharge. Most rechargeable batteries are permanently damaged if they are allowed to completely discharge. Accordingly, most flashlights and portable lanterns are powered with non-rechargeable dry cells, including alkaline cells, because of their relatively long shelf-life, output voltage, and relatively high charge or power capacity.

Most individuals test their flashlight batteries by turning the flashlight on. If the flashlight bulb lights up, the individual is satisfied that the batteries are functional. A much smaller group of people will disassemble the flashlight and test the batteries on a battery tester to determine the condition of the batteries. An even smaller group will test the batteries under both loaded and unloaded conditions to measure the voltage drop, which is a sensitive indicator of the remaining capacity of the batteries. Although it is not complicated to test batteries, it is time-consuming to disassemble the flashlight, remove the batteries, test the batteries, and, if they pass the test, reinstall the batteries and reassemble the flashlight.

Accordingly, it is an object of the present invention to provide a flashlight or a portable lantern having a built-in battery tester which permits the batteries to be quickly tested within the flashlight. Thus, with the flashlight of the present invention, the user can quickly and effortlessly determine the strength of the batteries. The user is thereby more likely to routinely check the condition of the batteries, and thus maintain the readiness of the flashlight or portable lantern.

SUMMARY OF THE INVENTION

This invention is directed to a flashlight or portable lantern having a built-in battery tester comprising:
 (a) a lantern housing adapted to hold batteries;
 (b) an electrically-powered light source mounted in said housing adapted to be energized by the batteries in said housing;
 (c) a battery-testing means mounted in said housing;
 (d) a three-way-switch means mounted in said housing adapted in a first position to connect the light source with the batteries, in a second position to connect the battery-testing means with the batteries, and in a third position to disconnect the batteries (that is, disconnect at least one pole of the batteries from the light source and testing means, and place the batteries in a no-load condition);
 (e) first conductor means for electrically connecting said light source with said switch means and the batteries; and
 (f) a second conductor means for electrically connecting said testing means with said switch means and said battery.

In an alternative embodiment of the present invention, the three-way-switch means, which is mounted in the housing, is adapted in a first position to connect said electrically-powered light source to the batteries, in a second position to connect both the electrically-powered light source and the testing means to the batteries, and in a third position to disconnect the batteries from said electrically-powered light source and testing means. In this embodiment, the flashlight is tested under a load.

In a further embodiment of the present invention, the portable lantern will have first and second switch means mounted in the housing, the first switch means in a first position electrically connecting said light source and the batteries and in a second position electrically disconnecting said light source and the batteries; the second switch means in a first position electrically connecting said battery-testing means and the batteries and in a second position electrically disconnecting said battery-testing means and the batteries. In this embodiment, the batteries can be tested under both no-load and loaded conditions.

The electrically-powered light source can be a portable lantern, a flashlight, an incandescent lamp, a portable, fluorescent lantern, or the like. A number of battery-testing means can be employed in the present invention, including voltmeters, ammeters, a continuous battery-testing circuit having a monitoring subcircuit, a combination voltage comparator circuit and a low-voltage signal circuit, a liquid-crystal voltage indicator, a light-emitting diode (LED), or a voltage-sensitive color-indicating cell.

In the first embodiment of the invention, the flashlight circuit and the battery-testing circuit are independent of each other. Because of the switching arrangement, the batteries only power one circuit at a time. Thus, in this embodiment, the batteries are tested on a no-load basis. In the second embodiment of the invention, the flashlight circuit can be run alone or in conjunction with the battery-testing circuit In this embodiment, the batteries are tested under a load. In the third embodiment of the invention, the flashlight circuit can be run alone or in conjunction with the battery-testing circuit, and, alternatively, the battery-testing circuit can be run alone or in conjunction with the flashlight circuit, thus giving the operator the opportunity to test the batteries in both no-load and loaded situations.

The modern non-rechargeable alkaline dry-cell portable lantern and flashlight batteries have a declining output voltage over their useful life New batteries have an output voltage of about 1.60 volts. After one hour of continuous use, a battery's voltage output (no-load) drops to between 1.40 and 1.45 volts. Thereafter, for the majority of the battery's useful life, the battery's no-load voltage gradually decreases in a somewhat linear fashion As the battery approaches the end of its useful life, the no-load voltage drops to about 1.0 volt. However, the battery still has some capacity and can be marginally used in this condition. When the battery's voltage drops below 1.0 volt, the battery is near the end of its life, and the remaining capacity of the battery is very limited. Near the point of exhaustion, the battery's output voltage rapidly drops from about 1.0 volt to about 0.5 or 0.6 volt.

The light-output candle-power of a portable lantern or flashlight bulb is somewhat sensitive to the battery voltage. Incandescent lamps are designed to operate optimally at a specific voltage. If that voltage is appreciably exceeded (such as, by 50%) for any period of time, the filament of the lamp will rapidly melt or vaporize, destroying the lamp. Most lamps are designed for voltages in increments of 1.2 volts. Thus, portable-lantern incandescent lamps are designed optimally for an input voltage of about 4.8 volts (the six-volt lantern), and single-cell, double-cell, triple-cell, four-cell, and five-cell flashlight incandescent lamps are designed for an input voltage of 1.2, 2.4, 3.6, 4.8, and 6.0 volts, respectively. However, flashlight and lantern bulbs will operate effectively over a broad range. For example, a two-cell lantern bulb will operate effectively from about 3.2 to about 2.0 volts. However, when the voltage of each battery drops below 1.0 volt, the output of the incandescent lamp is noticeably affected, and the color of the emitted light shifts from a yellow-white light to a yellow-red light. The portable lantern or flashlight will barely light up, however, when the input voltage to the incandescent lamp drops by more than 33% of the designed input voltage. Thus, many people continue to use a flashlight which has diminished power and a yellow-red light without realizing that the capacity of the batteries is nearing the point of exhaustion.

The present invention permits the user of a portable lantern or flashlight to quickly determine the voltage of a battery without disassembly of the flashlight or lantern. If the voltage is 1.0 volt or less, the owner of the lantern or flashlight can remove the batteries from the flashlight and replace them with fresh batteries. For those who rely on a flashlight as a tool-of-the-trade on a routine basis, such as a utility-meter reader, police officer, security guard, airplane mechanic, and the like, a more vigorous battery-testing circuit is desirable since it gives a better indication of the true capacity of the battery. A fresh, non-rechargeable dry-cell battery under a normal load will only experience a slight voltage drop from a noload condition. However, a battery that has had a fair amount of use will experience a greater voltage drop under load, even though it shows a good no-load voltage output. Thus, to a police officer or a fireman, a flashlight loaded with batteries having a remaining capacity of 50% (11 to 14 hours of operation for an alkaline cell) may not be satisfactory. These professionals have need to know the true battery condition.

Light-emitting diodes (LED's) have a threshold-activation voltage. If the input voltage to the LED is less than the threshold-activation voltage, the LED will not emit light. Accordingly, the battery-testing means of the present invention, when comprising an LED, will have an LED that will preferably have a threshold-activation voltage indicative of the batteries' condition, such as half-life.

The liquid-crystal indicator comprises a fully-enclosed liquid-crystal panel having a transparent window. The base plate of the sandwich is a high-dielectric material, optionally coated with a dielectric mirror in contact with the liquid crystal. The top plate of this sandwich is preferably transparent and, optionally, has a transparent conductive coating applied to the surface in contact with the liquid crystal. Voltage differential is induced across the liquid-crystal layer to either the base high-dielectric material or the high-dielectric transparent top panel, to induce a field. A high field (about 1000 volts or more per centimeter) and a liquid-crystal layer are required to cause change in the optical properties of the liquid crystal as liquid crystal changes from the nematic phase to the smectic phase. Such fields are easily achieved even with small voltage inputs from batteries by employing a high-dielectric base material and/or a high-dielectric top panel. Thus, when the liquid-crystal detector of the battery-testing means is in a non-energized state, it will have one optical appearance characteristic of the nematic phase. When the battery-testing means is activated, and the high-dielectric field is generated across the liquid-crystal sandwich, the liquid crystal will transform into the smectic phase, which has a different optical appearance from the nematic phase. If the batteries do not have sufficient voltage to achieve the threshold high-dielectric field to change the liquid crystal from the nematic to the smectic phase, no change will be observed to occur in the liquid crystal Thus, each liquid-crystal sandwich will be tailored, by controlling the thickness of the dielectric material in the sandwich, for a 1.5-volt system, a 3-volt system, a 4.5-volt system, and the like. Typical liquid crystals that can be employed include methoxybenzylidenebutylaniline and terephthal-bis-p-butylaniline. Liquid crystals are described in Kirk-Othmer, *Encyclopedia of Chemical Technology*, 3rd Ed., John Wiley & Sons, Vol. 7, pages 724–751 and Vol. 14, pages 395–427.

The voltage color-indicating battery-testing means of the present invention comprises a sealed cell having a transparent window. The cell is filled with an aqueous or non-aqueous composition, such as an aqueous phenolphthalein solution. Two spaced-apart electrodes in the cell are in contact with the color-indicating solution. When a voltage potential is induced across the electrodes, a redox reaction occurs which can cause a color change to the color-indicating solution. Each solution has its own unique threshold voltage wherein the redox reaction will commence. If the voltage of the battery is below that threshold voltage, no redox reaction will occur, and there will be no color change. The principles of such color-indicating battery tester are set forth in the Sterling U.S. Pat. No. 1,497,388. Oxidation-reduction (redox) indicators are disclosed by H. A. Fales and Frederic Kenny, *Inorganic Quantitative Analysis*, D. Appleton-Century Company, N.Y., 1939, pp. 391 et. seq.

DETAILED DESCRIPTION

Figure 1:
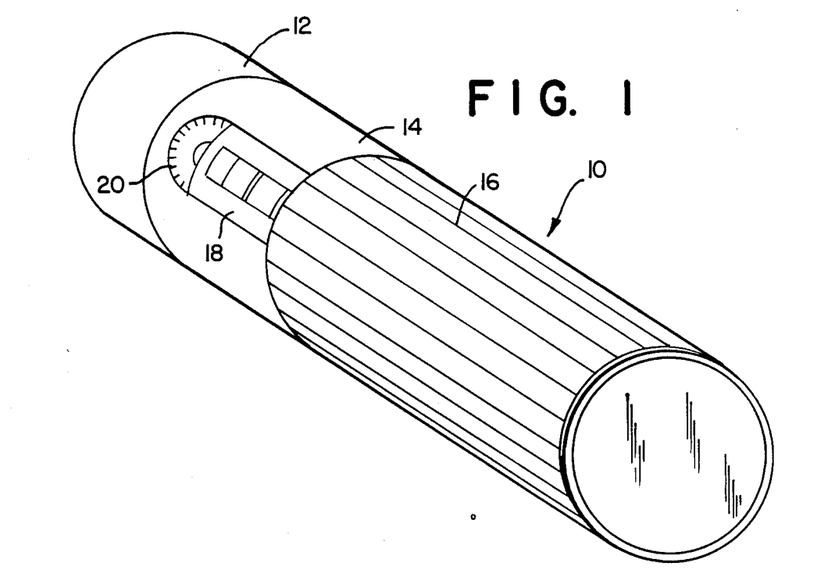
FIG. 1 is a perspective view of an improved flashlight with built-in battery tester of the present invention.

Referring to FIG. 1, the improved flashlight with built-in battery tester 10 comprises a flashlight housing having a front housing section 12, a middle housing section 14, and a rear housing section 16. A three-way switch 18 is mounted in the middle housing section 14 and a battery tester with an analog dial 20 is mounted in the middle housing section adjacent the switch.

Figure 2:
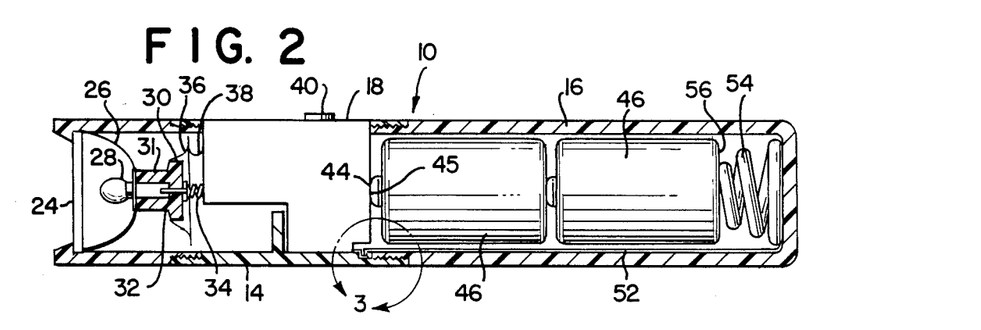
FIG. 2 is a side sectional view of the improved flashlight of FIG. 1.
Figure 3:
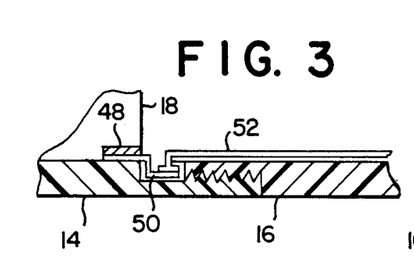
FIG. 3 is an enlarged sectional view of the encircled area 3—13 of FIG. 2.

Referring to FIG. 2, the improved flashlight with built-in battery tester has a clear, light, transparent lens or window mounted in the front of the front housing section. A parabolic reflector is mounted within the front housing section. An incandescent lamp 28 is mounted in an insulated lamp receiver 30 mounted within sleeve 31 of the reflector 26. The rear of the receiver has a conductor element 32, which is in electrical contact with the base electrode of the lamp and which comes in contact with bias conductor 34, which is connected to switch 18. A conductor cone 36 extends radially outward from the sleeve 31 and comes in contact with bias conductor 38 of switch 18. At the top of switch 18 is mounted a switch lever 40, which can be moved into one of three positions. The switch is shown in a position in which the lamp and the battery-tester circuit are disconnected from the batteries. Switch lever 40 can be advanced forward to a first position which activates the incandescent lamp. Alternatively, the switch lever can be moved back to a second position which activates the battery-tester circuit. The switch lever is preferably biased with a spring (not shown), which prevents the switch lever from remaining in the second position unless held in that position. Centered at the back of switch 18 is a battery-anode contact 44, which is adapted to receive the anode or electrode of battery 46. At the base or bottom of switch 18 is a cathode contact 48 (See FIG. 3.), which is in contact with and electrically connected to conductor 50. Conductor 50 is detachably in contact with conductor 52 of the rear housing section. The rear end of conductor 52 is in contact with and electrically connected to spring contact 54, which in turn is in contact with the rear-bottom cathode plate (not shown) of battery 46. Switch 18 is shown as a single housing comprising the switch mechanism and the battery testing mechanism. Optionally, the battery-testing mechanism and the switch mechanism may be in separate housings.

Figure 4:
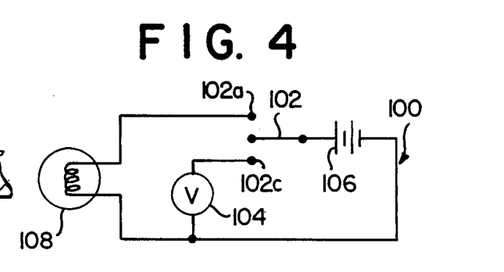
FIG. 4 is a schematic view of a flashlight and built-in battery tester circuit of the present invention.

Referring to FIG. 4, an improved flashlight circuit with a battery-tester circuit is shown. The flashlight comprises a three-position switch 102, one end of which is connected to the anode of battery 106. The cathode end of battery 106 is connected to one side of voltmeter 104 and to one side of incandescent lamp 108. The other side of incandescent lamp 108 is connected to a first-position switch contact 102a. The other side of the voltmeter is connected to a third-position switch contact 102c. As shown, the switch is in a second position (off position), wherein the battery is disconnected, that is, the battery is disconnected from the flashlight circuit and from the voltmeter circuit. To activate the flashlight circuit, the switch is moved to the first switch position 102a to energize the incandescent lamp. To test the battery, the switch is moved to the third switch position 102c to complete the voltmeter battery circuit. In this embodiment of the invention, the battery is tested under a no-load condition. The switch is preferably biased to prevent it from remaining in the third switch position.

Figure 5:
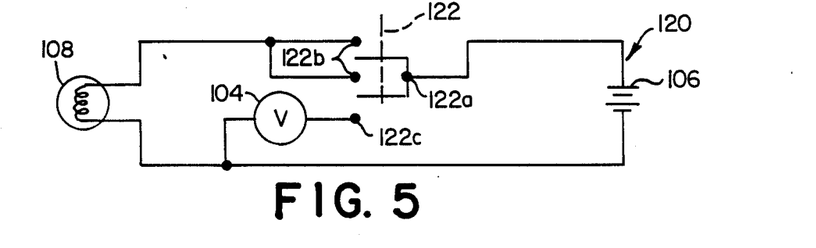
FIG. 5 is a schematic view of an alternative flashlight and built-in battery-tester circuit of the present invention.

Referring to FIG. 5, an improved flashlight with built-in battery-tester circuit is shown comprising a ganged double-pole three-position switch 122. The common contact 122a of the switch is connected to the anode of the battery 106. The cathode of the battery is connected descent lamp 108. The other side of the incandescent lamp is connected to common contacts 122b. The other side of voltmeter 104 is connected to contact 122c. When switch 122 is moved to a first position, contacts 122a and 122b are connected by the switch to complete the circuit between the incandescent lamp and the battery circuit. When switch 122 is moved to a third position, contacts 122a, 122b, and 122c are connected by the switch to complete the circuits between both the incandescent lamp and the voltmeter with the battery. In the second switch position, which is illustrated in FIG. 5, the battery is disconnected, that is, the battery is disconnected from both the incandescent lamp and the voltmeter. In this embodiment of the present invention, the voltage of the battery is determined when the battery is under load. The switch is preferably biased to prevent it from remaining in the third position.

Figure 6:
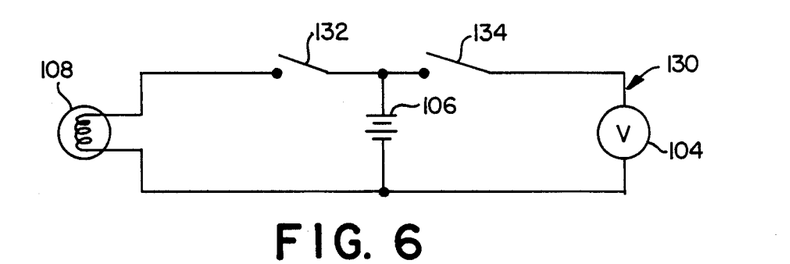
FIG. 6 is a schematic view of an alternative flashlight circuit and built-in battery tester of the present invention.

Referring to FIG. 6, an alternative improved flashlight with built-in battery tester is shown. In this embodiment, the circuit has two switches 132 and 134. The flashlight circuit can be operated independently of the battery-tester circuit, and vice versa. However, in this embodiment, the battery can be tested either under no load or under a load. When switch 132 is closed, the circuit between battery 106 and incandescent lamp 108 is completed. Similarly, when switch 134 is closed, the circuit between voltmeter 104 and battery 106 is complete The switch 134 is preferably biased to an open position.

Although the improved flashlight with built-in battery tester of the present invention has been illustrated above primarily with a voltmeter, the battery tester can comprise an ammeter, a wattmeter, a liquid-crystal cell, a color-indicator redox cell, or other similar device which will indicate the strength, voltage, and/or capacity of the batteries.

Figure 7:
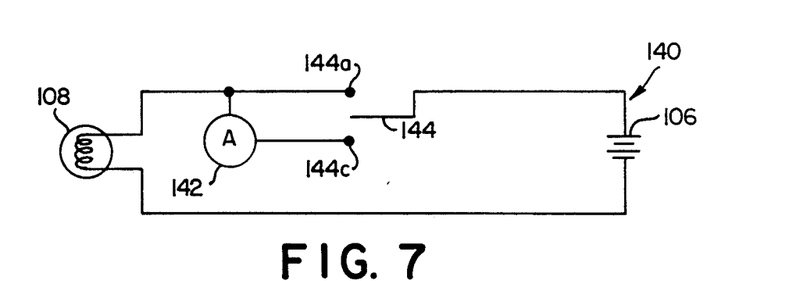
FIG. 7 is a schematic view of another alternative flashlight circuit and built-in battery-tester circuit of the present invention.

Referring to FIG. 7, another alternative embodiment of the improved flashlight circuit with a built-in battery-tester circuit is shown. In this circuit, the battery condition is tested with an ammeter, rather than a voltmeter. To actuate the incandescent lamp alone, switch 144 is closed to a first switch position 144a to complete the circuit between the incandescent lamp 108 and the battery 106. To test the batteries, the switch 144 is moved to a third switch position 144c, which puts the ammeter in series with the incandescent lamp 108 and completes the circuit of the batter 106, incandescent lamp 108, and the ammeter 142. To prevent a drain on the battery, switch 144 is preferably biased so that the switch will not remain in the third switch position. Switch 144 is placed in a second position (shown in FIG. 7), which disconnects the battery, that is, disconnects the battery from the ammeter and the incandescent lamp 108.

The improved flashlight with built-in battery-tester circuit shown above preferably comprises a battery-tester circuit that is used intermittently in order to prevent a continual drain on the battery However, the battery-tester circuit can comprise the type of circuit that automatically intermittently monitors the voltage of the battery, compares the voltage of the battery with a standard voltage, and initiates a signal when the battery voltage falls below the standard voltage. There are a number of circuits that can be employed to carry this out, such as the circuit shown in U.S. Pat. Nos. 4,227,191; 4,342.954; 4,432,041; and 4,563,629.

For an automatic monitoring battery-testing system, the circuit will comprise a battery voltage-monitoring circuit that will monitor the voltage of the battery at said intervals, such as, once every 10 seconds, once every minute, or once every 15 minutes, using a conventional oscillator. The monitoring circuit will incorporate a voltage comparator circuit that will compare the battery voltage with a standard reference voltage. The stable reference voltage is provided by a xener diode or the like. If the battery voltage falls below the standard reference voltage, the voltage comparator circuit will trigger a signalling circuit that will furnish audio and/or visual signal(s) to indicate the low battery condition of the flashlight or portable lantern. Optionally, the flashlight can include both an automatic battery-monitoring circuit and one of the above built-in battery-testing circuits so that, upon activation of the low-battery signal, the operator of the flashlight or portable lantern can double-check the condition of the batteries.

Although the invention has been described with respect to a flashlight, the above embodiments also apply to portable battery-powered lanterns. It applies to both flashlights and lanterns having incandescent lamps, fluorescent lamps, or other gas-discharge light sources. As mentioned above, incandescent lamps will function over a fairly wide voltage range. In fact, many flashlight and portable lantern incandescent lamps will give some light output even at very low voltages. However, gas-discharge-type light sources, such as fluorescent lamps, have a predetermined operation voltage which must be maintained for operation of the lamp. If the voltage falls below this value, the lamp is extinguished. Even more critical, these lamps require a stepped-up starting voltage to initiate the initial discharge to operate the lamps. If this voltage cannot be achieved, the lamp cannot be "activated." Portable lanterns employing fluorescent lamps and other types of gas-discharge lamps, employ conventional circuitry to step up the voltage from the batteries for operation. Most portable lanterns use an input voltage of about 4.8 volts, 7.2 volts, or 9.6 volts, and will not operate if the voltage drops below 4.0 volts, 6.0 volts, or 8.0 volts, respectively. Thus, for portable lanterns using fluorescent lamps or other types of gas-discharge lamps, it is important for the batteries to have a good output voltage under load, and good remaining capacity Thus, a lantern having batteries with only 50% capacity remaining may not be operable, especially if the lantern is exposed to a temperature drop, causing a reduction in the voltage output of the batteries. For such lanterns, it is therefore important to know the condition of the batteries. Unfortunately, initiation of a fluorescent lamp or a gas-discharge lamp requires a considerable expenditure of energy so that it is not normally economical or practical to routinely test the batteries of such a lantern under actual load conditions. However, the circuit shown in FIG. 8 can be employed in such a lantern The circuit of FIG. 8 tests the battery under a simulated start-up load to give a good indication of the strength of the battery Referring to FIG. 8, a portable lantern circuit 150 is shown having a fluorescent lamp 152; a starter/ballast circuit 154 for initiating discharge of the fluorescent lamp and maintaining the necessary operational voltage; a battery 156 having an output voltage of at least 4.0, 6.0, or 8.0 volts, dependent upon the fluorescent lamp and the starter/ballast system; and a resistor 158, which simulates the start-up load on the battery in the portable lantern portion of the circuit The lantern is operated by closing switch 132 to complete the circuit between the battery 156, the fluorescent lamp 152, and the starter/ballast circuit 154. The battery-tester circuit is operated by closing switch 134, which completes the circuit between battery 156 and voltmeter 104 and resistor 158.

Figure 8:
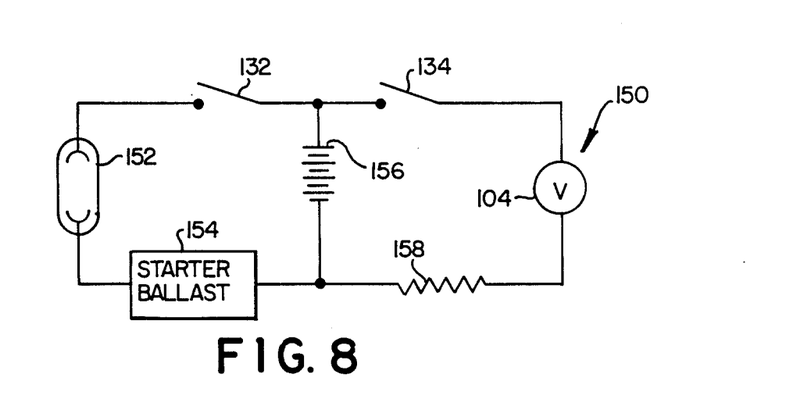
FIG. 8 is a schematic view of another alternative flashlight circuit and built-in battery-tester circuit of the present invention.

The circuit of FIG. 8 can also employ a three-position switch, such as the switch illustrated in FIG. 4.

The above-identified flashlight and portable lanterns have been illustrated, except with respect to the circuit of FIG. 8, with input voltages of three volts. However, the above circuits can be used on flashlights and portable lanterns having a plurality of batteries, such as a single-cell flashlight, a 12-cell portable lantern, and the like.

Figure 9:
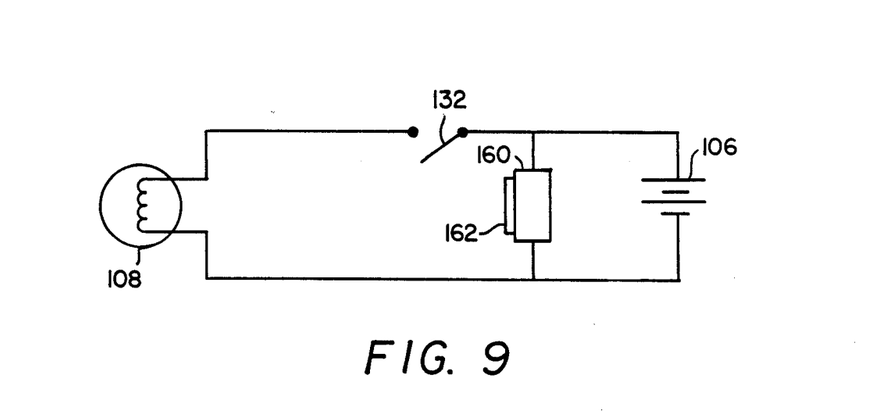
FIG. 9 is a schematic view of another alternative flashlight circuit and built-in battery tester circuit of the present invention using a liquid crystal.

FIG. 9 shows an alternative improved flashlight with built-in battery tester using a single switch 132 along with a liquid crystal 160 and lens 162, which are placed in parallel with a battery 106 when the switch is closed. The battery is also in parallel with an incandescent lamp 108. Whether or not the switch 132 is open or closed, the liquid crystal 160 always displays the charge condition of the battery.

Figure 10:
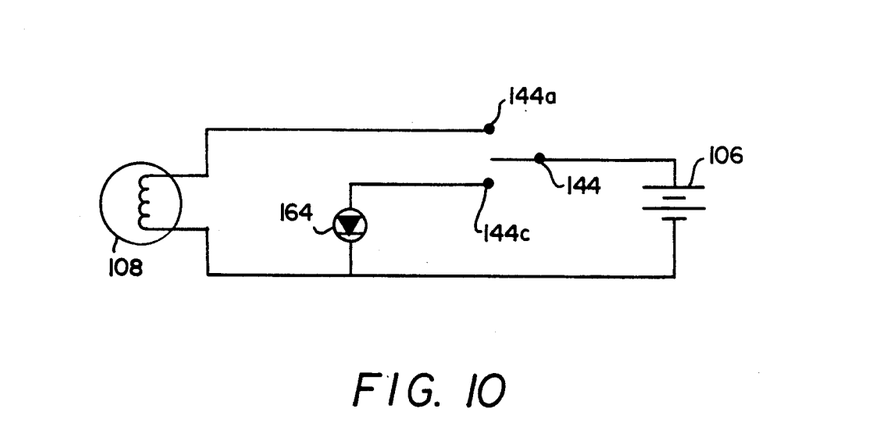
FIG. 10 is schematic view of another alternative flashlight circuit and built-in battery tester circuit of the present invention employing a light emitting diode.

FIG. 10 shows an alternative improved flashlight with built-in battery tester employing a light emitting diode 164. The flashlight comprises a three-precision switch 144, one end of which is connected to the anode of battery 106 while the cathode of battery 106 is connected to one side of light emitting diode 164 and to one side of incandescent lamp 108. The other side of incandescent lamp 108 is connected to a first position switch contact 144A while the other side of the light emitting diode 164 is connected to a third position switch contact 144C. As shown, the switch is in the second position (off position), wherein the battery is disconnected from the flashlight circuit and from the light emitting diode. To activate the flashlight circuit, the switch is moved to the first switch position 144A to energize the incandescent lamp 108. To test the battery, the switch is moved to the third emitting circuit. In this embodiment of the invention, the battery is tested under a no-load condition.

Three sets of batteries were tested in three identical flashlights, with the batteries being switched between the flashlights on a routine basis. The results of the tests are shown in the following tables. (The Roman numerals I, II, and III indicate the flashlight, and the numbers 1A, 1B, 2A, 2B, 3A, and 3B indicate the individual batteries.) The first set of batteries (1A and 1B) were Energizer brand alkaline batteries; the second set (2A and 2B) were Duracell brand alkaline batteries, and the third set (3A and 3B) were Eveready brand zinc-carbon batteries. The batteries were "D" size batteries. Battery 2A failed after 32 hours and was replaced with a 3-year-old Duracell alkaline battery having a no-load voltage of 0.99 volt.

The flashlights were two-cell flashlights having incandescent lamps. The incandescent lamps were rated at 1.2 volts and 0.5 amp. The cold-filament internal resistance of the incandescent lamps was about 0.4 amp. The hotfilament internal resistance of the incandescent lamps was not measured.

Each flashlight was loaded with a set of batteries and turned on. From time to time, the flashlights were turned off and the no-load output voltage of the batteries was measured. On a periodic basis, the output voltage of the batteries under load was also measured. The tests were not run on a continuous, 24-hour basis, but were run for periods of approximately 12 hours during the first two days, about 3 hours the third day, about 7 hours the fourth day, about 6 hours the ninth day, and 20 minutes the tenth day. No tests were conducted during the fifth, sixth, seventh, and eighth days. The results show that the useful life of a battery is near exhaustion when the voltage of the battery has fallen below 1.0 volt. After the voltage of the battery drops below 1.0, the discharge rate of the battery (indicated by the voltage drop) can exceed 0.5 volt in a half-hour.

It appears, from the tables, that the useful life of the 1A and 1B batteries is about 28 to 29 hours and the half-life is about 14 hours where the output voltage is about 1.2 volts. When the output voltage of the batteries is about 1.3 volts, the batteries have about 75% of their operating life remaining. When the voltage of the batteries is about 1.1 volts, the batteries have about 25% of their useful life remaining.

The 2A and 2B batteries appear to have a useful life of about 23 hours and a half-life of about 12 hours where the output voltage is about 1.2. When the output voltage of the batteries is about 1.3 volts, the batteries have about 75% of their useful life remaining. When the output voltage drops to about 1.15 volts, the batteries have only about 25% of their remaining useful life.

Batteries 3A and 3B, which are zinc-carbon batteries (LeChanche cell), had a much shorter life span than the alkaline batteries. These batteries had a useful life of about 7.5 hours, with a half-life of about 3.5 to about 4 hours where the output voltage is about 1.2 volts. When the batteries' output voltage is about 1.3 volts, the batteries have about 75% of their remaining useful life. When the batteries' output voltage drops to about 1.1 volts, the batteries have only about 25% of their useful life remaining.

When the no-load output voltage of the batteries dropped below 1.0 volt, all the batteries exhibited rapid voltage drops. When the batteries reached the end of their useful life, the flashlights were turned off and the batteries were allowed to rest. Surprisingly, the batteries' output voltage would rebound and the batteries could be operated for brief periods. As this cycle of rest and use was continued, the batteries' ability to rebound decreased and the batteries experienced much more rapid voltage drops under load. From the information gathered in this experiment, it appears that, ideally, the flashlights would be equipped with indicators that indicated when each battery's voltage output had dropped below about 1.2 volts, indicating that the battery had only 50% of its useful life charge remaining.

The tests also indicate that, when the batteries are fresh, the total voltage drop of a pair of batteries in series is somewhere from about 0.45 to about 0.65 volt; that is, the total output voltage of the two batteries in the flashlight under no-load will be about 3 volts, and under load will be about 2.5 volts. As the batteries approached their half-life, the voltage drops for the two batteries increased to about 0.75-about 0.95 volt. When the batteries approached the end of their useful life, the voltage drop was in excess of 1.0 volt; that is, the output voltage of the two batteries under no-load was from about 2.0 to about 2.2, and the voltage drop was from about 1.0 volt to about 1.7 volts. A flashlight incorporating the circuit of FIG. 5 or FIG. 6 can test the batteries under a load condition and, thus, can quickly determine the condition of the batteries In addition, a flashlight equipped with the circuit of FIG. 6 can also compare the no-load voltage to the load voltage.

The tests also show that, when batteries have reached their exhaustion point but are allowed to rest for a few hours, their no-load output voltage will exceed 1.0 volt. However, when the batteries are then put under a load, the working voltage of the batteries rapidly drops to as low as 0.6 volt. This voltage drop can be observed because the output voltage of the batteries in the weakened condition does not drop in a single-step manner but continues to drop over time, sometimes taking as long as 30 seconds to stabilize. For example, two used Duracell brand alkaline batteries, each having a no-load output voltage of about 0.95 volt, were placed in a flashlight for one hour. At the end of the hour, the no-load output voltage of the batteries was about 0.45 and 0.5 volt, respectively. The batteries were put under a load, and the voltage immediately dropped to between 0.6 and 0.7 volt, for both batteries in series, and then continued to drop, over a 30-second period, for a final value, for both batteries in series, of 0.48 volt. This same type of phenomenon was observed with the Energizer brand alkaline batteries and with the Eveready brand zinc-carbon batteries. Thus, the flashlight equipped with exhausted batteries may give a strong light source for a short period of time, but then will quickly decrease in power under the flashlight load.

TABLE I

BATTERY OUTPUT VOLTAGE IN OPERATION

| Time (Hours) | 1A | 1B | 2A | 2B | 3A | 3B |
|---|---|---|---|---|---|---|
| 0.00 | 1.60 | 1.60 | 1.59 | 1.60 | 1.60 | 1.60 |
| 1.00 | 1.45 | 1.45 | 1.45 | 1.45 | 1.35 | 1.35 |
| 1.50 | 1.40 | 1.45 | 1.40 | 1.40 | 1.30 | 1.30 |
| 2.00 | 1.40 | 1.40 | 1.35 | 1.35 | 1.30 | 1.30 |
| 2.50 | 1.39 | 1.39 | 1.35 | 1.35 | 1.30 | 1.30 |
| 3.50 | 1.39 | 1.39 | 1.32 | 1.32 | 1.20 | 1.20 |
| 4.50 | 1.39 | 1.39 | 1.30 | 1.30 | 1.20 | 1.19 |
| 5.50 | 1.30 | 1.30 | 1.30 | 1.30 | 1.10 | 1.10 |
| 6.50 | 1.30 | 1.30 | 1.30 | 1.30 | 1.05 | 1.02 |
| 7.50 | 1.30 | 1.30 | 1.29 | 1.29 | 1.01 | 1.01 |
| 10.00 | 1.29 | 1.29 | 1.28 | 1.25 | 0.89 | 0.75 |
| 11.00 | 1.28 | 1.28 | 1.25 | 1.25 | 0.80* | 0.55* |
| 12.00 | 1.25 | 1.25 | 1.20 | 1.20 | 0.75* | 0.60* |
| 12.50 | 1.20 | 1.20 | 1.20 | 1.20 | 0.78* | 0.60* |
| TEST DISCONTINUED FOR 10.25 HOURS |
| 12.50 | 1.35 | 1.35 | 1.36 | 1.36 | 1.25 | 1.20 |
| 12.75 | 1.30 | 1.30 | 1.30 | 1.30 | 1.05 | 0.90 |
| 13.00 | 1.29 | 1.29 | 1.28 | 1.26 | 0.95 | 0.75 |
| 13.25 | 1.27 | 1.25 | 1.25 | — | 0.80 | 0.51 |
| 13.50 | 1.26 | 1.25 | 1.25 | 1.25 | 0.89 | 0.70 |
| 14.10 | 1.22 | 1.22 | 1.21 | 1.20 | 0.71 | 0.55 |
| 15.25 | 1.21 | 1.21 | 1.20 | 1.20 | 0.91 | 0.80 |
| 16.25 | 1.21 | 1.20 | 1.18 | 1.18 | 0.61 | 0.40 |
| 17.25 | 1.20 | 1.20 | 1.18 | 1.16 | 0.60 | 0.00 |
| 18.50 | 1.20 | 1.19 | 1.15 | 1.15 | DISCONTINUED | |
| 19.50 | 1.19 | 1.16 | 1.10 | 1.10 | DISCONTINUED | |
| 20.50 | 1.13 | 1.11 | 1.10 | 1.10 | 0.99 | 0.81 |
| 22.25 | 1.10 | 1.10 | 1.04 | 1.05 | 0.49 | 0.00 |
| 23.25 | 1.05 | 1.05 | 1.01 | 1.01 | 0.55 | 0.00 |
| 24.50 | 1.05 | 1.05 | 0.89 | 0.93 | 0.80 | 0.00 |
| 25.75 | 1.02 | 1.02 | 0.49 | 0.90 | DISCONTINUED | |
| TEST DISCONTINUED FOR 9 HOURS |
| 25.75 | 1.19 | 1.20 | 1.20 | 1.20 | — | — |
| 26.75 | 1.01 | 1.01 | 0.99 | 0.99 | — | — |
| 27.90 | 1.00 | 1.00 | 0.95 | 0.95 | — | — |
| 28.50 | 0.99 | 0.99 | 0.85 | 0.86 | — | — |
| TEST DISCONTINUED FOR 21.5 HOURS |
| 28.50 | 1.11 | 1.12 | 1.12 | 1.11 | — | — |
| 29.50 | 0.99 | 0.99 | 0.90 | 0.89 | — | — |
| 32.25 | 0.94 | 0.95 | 0.39 | 0.95 | — | — |
| TEST DISCONTINUED FOR 2 HOURS |
| 32.25 | 0.98 | 0.98 | 0.99* | 0.90 | — | — |
| 34.40 | 0.81 | 0.91 | 0.91* | 0.80 | — | — |
| 35.75 | <.65 | <.65 | <.65* | <.65 | — | — |
| TEST DISCONTINUED FOR 112.5 HOURS |
| 35.75 | 1.09 | 1.09 | 1.12* | 1.10 | — | — |
| 40.35 | <.65 | <.65 | <.65* | <.65 | — | — |
| TEST DISCONTINUED FOR 3.25 HOURS |
| 40.35 | 0.98 | 0.99 | 0.95* | 0.98 | — | — |
| 41.35 | 0.60 | 0.52 | 0.45* | 0.54 | — | — |
| TEST DISCONTINUED FOR 13.75 HOURS |
| 41.35 | 1.01 | 1.01 | 0.99* | 0.97 | — | — |
| 41.70 | 0.71 | 0.79 | 0.50* | 0.70 | — | — |
| TEST DISCONTINUED FOR 2 MINUTES |
| 41.70 | 0.90 | 0.91 | 0.80* | 0.81 | — | — |

*Replacement for Battery 2A

Table II sets forth the measured battery voltage drop of batteries 1A, 1B, 2A, and 2B under load. The tests were commenced when the batteries passed their operational half-life. As can be seen, the voltage drop of a battery under load increased as the battery approached the end of its useful life. More indicative than the actual drop, is the amount of time it takes to stabilize the voltage under load. During the useful life of the battery, a voltage drop from the no-load voltage to the load voltage of the battery is an immediate single-step voltage drop. When the batteries are beyond their useful life, the voltage drop is a continuous, slow drop that can take some time to stabilize, sometimes exceeding 30 seconds. This is indicative that the batteries are exhausting their limited capacities.

TABLE II

BATTERY VOLTAGE DROP UNDER LOAD

| | Batteries 1A & 1B | | | Batteries 2A & 2B | | |
|---|---|---|---|---|---|---|
| Test Time (Hrs) | No Load Voltage | Voltage Under Load | Voltage Drop | No Load Voltage | Voltage Under Load | Voltage Drop |
| 16.25 | 2.39 | 1.96 | 0.43 | 2.30 | 1.88 | 0.47 |
| 18.50 | 2.35 | 1.89 | 0.46 | 2.28 | 1.89 | 0.39 |
| 20.50 | 2.30 | 1.85 | 0.45 | 2.20 | 1.80 | 0.40 |
| 22.25 | 2.23 | 1.80 | 0.43 | 2.10 | 1.71 | 0.39 |
| 23.25 | 2.15 | 1.61 | 0.54 | 2.05 | 1.51 | 0.54 |
| 24.50 | 2.11 | 1.60 | 0.51 | 1.90 | 1.49 | 0.41 |
| 25.75 | — | — | — | 1.94 | 1.46 | 0.48 |
| TEST DISCONTINUED FOR 9 HOURS | | | | | | |
| 25.75 | 2.32 | 1.70 | 0.62 | 2.35 | 1.75 | 0.60 |
| 26.75 | 2.08 | 1.40 | 0.68 | 2.01 | 1.52 | 0.49 |
| 27.90 | 2.02 | 1.40 | 0.62 | 1.82 | 1.30 | 0.52 |
| TEST DISCONTINUED FOR 21.5 HOURS | | | | | | |
| 29.50 | 1.99 | 1.29 | 0.70 | 1.81 | 1.20 | 0.61 |
| 32.25 | 1.92 | 1.35 | 0.57 | 1.49* | 0.10* | 1.39* |
| TEST DISCONTINUED FOR 112.5 HOURS | | | | | | |
| 35.75 | 2.18 | 1.31 | 0.87 | 2.21* | 1.10* | 1.11* |
| TEST DISCONTINUED FOR 3.25 HOURS | | | | | | |
| 41.35 | 1.80 | 0.91 | 0.89 | 1.00* | 0.48* | 0.52* |

*Replacement for Battery 2A

We claim:

1. A portable lantern having a built-in battery tester comprising:
   (a) a lantern housing for holding batteries;
   (b) an electrically-powered light source mounted in said housing for energizing by the batteries in said housing;
   (c) a battery-testing means mounted in said housing with indicator means of the battery-testing means detectable from outside said housing;
   (d) a three-way-switch means mounted in said housing placed in a first position to connect the light source with the batteries, in a second position to connect the battery-testing means with the batteries, and in a third position to disconnect the batteries;
   (e) first conductor means for electrically connecting said light source to said switch means and the batteries when said switch means is in said first position; and
   (f) second conductor means for electrically connecting said battery-testing means to said switch means and the batteries when said switch means is in said second position.

2. The portable lantern according to claim 1 wherein said electrically-powered light source is an incandescent lamp.

3. The portable lantern according to claim 1 wherein said electrically-powered light source is a fluorescent lamp.

4. The portable lantern according to claim 1 wherein said electrically-powered light source is a light-emitting gas-discharge tube.

5. The portable lantern according to claim 1 wherein said battery-testing means is a voltmeter.

6. The portable lantern according to claim 1 wherein said battery-testing means is an ammeter.

7. The portable lantern according to claim 1 wherein said battery-testing means comprises a battery-monitoring circuit that monitors the voltage of the battery for brief pulses at predetermined time intervals, a voltage-comparator circuit that compares the battery voltage with a standard reference voltage, and a signal-means circuit that emits a signal when the voltage-comparator circuit detects that the battery voltage has fallen below said standard reference voltage.

8. The portable lantern according to claim 7 wherein the signal means generates an audible signal.

9. The portable lantern according to claim 7 wherein the signal means generates a visual signal.

10. The portable lantern according to claim 1 wherein said battery-testing means comprises a liquid-crystal cell with a transparent window that yields a visual phase change when the battery voltage exceeds a predetermined value.

11. The portable lantern according to claim 1 wherein said battery-testing means comprises a light-emitting diode that illuminates when the battery voltage is above a predetermined value.

12. The portable lantern according to claim 1 wherein said battery-testing means comprises a color-indicating redox cell which indicates a predetermined voltage value by color.

13. The portable lantern according to claim 12 wherein the color-indicating redox cell comprises a hollow sealed cell having a central chamber, a transparent window, and two spaced-apart electrodes, one end of each electrode terminating in the central chamber of said cell in a spacedapart relationship, the central chamber containing a chemical composition that undergoes a redox reaction at a predetermined voltage level which causes a color change to the chemical composition.

14. A portable electric lantern having a built-in battery tester comprising:
 (a) a lantern housing for holding batteries;
 (b) an electrically-powered light source mounted in said housing for energizing by the batteries in said housing;
 (c) a battery-testing means mounted in said housing with indicator means of the battery-testing means detectable from outside said housing;
 (d) a three-way-switch means mounted in said housing placed in a first position to connect the light source to the batteries, in a second position to connect said light source and said battery-testing means to the batteries, and in a third position to disconnect the batteries from said light source and said testing means;
 (e) first conductor means for electrically connecting said light source to said switch means and the batteries when said switch means is in said first position; and
 (f) second conductor means for electrically connecting said battery-testing means to said switch means and the batteries when said switch means is in said second position;

15. The portable lantern according to claim 14 wherein said electrically-powered light source is an incandescent lamp.

16. The portable lantern according to claim 14 wherein said electrically-powered light source is a fluorescent lamp.

17. The portable lantern according to claim 14 wherein said electrically-powered light source is a light-emitting gas-discharge tube.

18. The portable lantern according to claim 14 wherein said battery-testing means is a voltmeter.

19. The portable lantern according to claim 14 wherein said battery-testing means is an ammeter.

20. The portable lantern according to claim 14 wherein said battery-testing means comprises a battery-monitoring circuit that monitors the voltage of the battery for brief pulses at predetermined time intervals, a voltage-comparator circuit that compares the battery voltage with a standard reference voltage, and a signal-means circuit that emits a signal when the voltage-comparator circuit detects that the battery voltage has fallen below said standard reference voltage.

21. The portable lantern according to claim 20 wherein the signal means generates an audible signal.

22. The portable lantern according to claim 20 wherein the signal means generates a visual signal.

23. The portable lantern according to claim 14 wherein said battery-testing means comprises a liquid-crystal cell with a transparent window that yields a visual phase change when the battery voltage exceeds a predetermined value.

24. The portable lantern according to claim 14 wherein said battery-testing means comprises a light-emitting diode that illuminates when the battery voltage is above a predetermined value.

25. The portable lantern according to claim 14 wherein said battery-testing means comprises a color-indicating redox cell which indicates a predetermined voltage value by color.

26. The portable lantern according to claim 14 wherein the color-indicating redox cell comprises a hollow sealed cell having a central chamber, a transparent window, and two spaced-apart electrodes, one end of each electrode terminating in the central chamber of said cell in a spacedapart relationship, the central chamber containing a chemical composition that undergoes a redox reaction at a predetermined voltage level which causes a color change to the chemical composition.

27. A portable lantern having a built-in battery tester comprising:
 (a) a lantern housing for holding batteries;
 (b) an electrically-powered light source mounted in said housing for energizing by the batteries in said housing;
 (c) a battery-testing means mounted in said housing with indicator means of the battery-testing means detectable from outside said housing;
 (d) a switch means mounted in said housing placed in a first position to connect the light source with the batteries and in a second position to disconnect the batteries;
 (e) first conductor means for electrically connecting said light source to said switch means and the batteries when said switch means is said first position; and
 (f) second conductor means for electrically connecting said battery-testing means to the batteries when said switch means is in said second position.

28. The portable lantern according to claim 27 wherein said electrically-powered light source is an incandescent lamp.

29. The portable lantern according to claim 27 wherein said electrically-powered light source is a fluorescent lamp.

30. The portable lantern according to claim 27 wherein said electrically-powered light source is a light-emitting gas-discharge tube.

31. The portable lantern according to claim 27 wherein said battery-testing means is a voltmeter.

32. The portable lantern according to claim 27 wherein said battery-testing means is an ammeter.

33. The portable lantern according to claim 27 wherein said battery-testing means comprises a battery-monitoring circuit that monitors the voltage of the battery for brief pulses at predetermined time intervals, a voltage-comparator circuit that compares the battery voltage with a standard reference voltage, and a signal-means circuit that emits a signal when the voltage-comparator circuit detects that the battery voltage has fallen below said standard reference voltage.

34. The portable lantern according to claim 33 wherein the signal means generates an audible signal.

35. The portable lantern according to claim 33 wherein the signal means generates a visual phase change signal.

36. The portable lantern according to claim 27 wherein said battery-testing means comprises a liquid-crystal cell with a transparent window that yields a visual phase change when the battery voltage exceeds a predetermined value.

37. The portable lantern according to claim 27 wherein said battery-testing means comprises a light-emitting diode that illuminates when the battery voltage is above a predetermined value.

38. The portable lantern according to claim 27 wherein said battery-testing means comprises a color-indicating redox cell which indicates a predetermined voltage value by color.

39. The portable lantern according to claim 38 wherein the color-indicating redox box cell comprises a hollow sealed cell having a central chamber, a transparent window, and two spaced-apart electrodes, one end of each electrode terminating in the central chamber of said cell in a spaced-apart relationship, the central chamber containing a chemical composition that undergoes a redox reaction at a predetermined voltage level which causes a color change to the chemical composition.

* * * * *